United States Patent
Fukui et al.

(10) Patent No.: US 8,270,181 B2
(45) Date of Patent: Sep. 18, 2012

(54) MECHANISM FOR LOCKING A BOARD ONTO A CHASSIS

(75) Inventors: Kazuo Fukui, Hadano (JP); Michihito Watarai, Isehara (JP)

(73) Assignee: Hitachi, Ltd., Tokyo (JP)

( * ) Notice: Subject to any disclaimer, the term of this patent is extended or adjusted under 35 U.S.C. 154(b) by 484 days.

(21) Appl. No.: 12/335,562

(22) Filed: Dec. 16, 2008

(65) Prior Publication Data

US 2009/0262508 A1 Oct. 22, 2009

(30) Foreign Application Priority Data

Feb. 26, 2008 (JP) ................................. 2008-044179

(51) Int. Cl.
*H05K 7/18* (2006.01)
(52) U.S. Cl. ........ 361/801; 361/740; 361/802; 361/810; 361/807; 361/759
(58) Field of Classification Search .................. 361/732, 361/801, 759, 740, 802
See application file for complete search history.

(56) References Cited

U.S. PATENT DOCUMENTS

| | | | | |
|---|---|---|---|---|
| 5,575,546 A * | 11/1996 | Radloff | ......................... | 312/183 |
| 6,366,470 B1 * | 4/2002 | Goessel et al. | ................ | 361/796 |
| 6,469,904 B1 * | 10/2002 | Vigeant et al. | ................ | 361/752 |
| 7,130,200 B1 * | 10/2006 | Liu | ................ | 361/801 |
| 2003/0103326 A1 * | 6/2003 | Hsu | ................ | 361/683 |
| 2004/0052063 A1 * | 3/2004 | Megason et al. | ............. | 361/801 |
| 2007/0175130 A1 * | 8/2007 | Chen et al. | ....................... | 52/235 |
| 2007/0242442 A1 * | 10/2007 | Dai | ................ | 361/801 |

FOREIGN PATENT DOCUMENTS

| JP | 2003-318575 | 11/2003 |
|---|---|---|
| JP | 2007-184359 | 7/2007 |

* cited by examiner

*Primary Examiner* — Tuan T Dinh
*Assistant Examiner* — Steven Sawyer
(74) *Attorney, Agent, or Firm* — Mattingly & Malur, PC

(57) ABSTRACT

A mechanism for locking boards with various components mounted on them onto the chassis of an electronic device is composed of brackets, which are attached to these boards and which are to be mounted onto the chassis at a series of fixation points provided at certain intervals on it, and a locking element having a number of tongue-shaped pieces. Locking is accomplished by inserting each of these tongue-shaped pieces between a pair of adjacent brackets so that it engages with them. This mechanism requires fewer components than conventional mechanisms and is also easier to operate.

9 Claims, 5 Drawing Sheets

MECHANISM FOR LOCKING A BOARD ONTO A CHASSIS

PRIORITY APPLICATION

This application claims the benefit of priority from Japanese Patent 2008-44179, filed Feb. 26, 2008, the disclosure of which also is entirely incorporated herein by reference.

BACKGROUND OF THE INVENTION

1. Field of the Invention

The present invention relates generally to a mechanism for locking one or more boards onto a chassis or a casing, and in particular, to a mechanism for locking one or more boards, on each of which electronic components are mounted, onto the chassis or casing of an electronic device.

2. Description of the Related Art

In an electronic device such as a computer, which is composed of a number of units such as a power supply unit and logic units and/or packages such as I/O cards, it is important, in terms of the functionality of the device, that they can be mounted onto or dismounted from the chassis even while the device is running. Furthermore, as the operating frequencies of the LSI chips such as the processors mounted on such a computer keep rising, it is becoming increasingly important to devise a method of locking the metallic parts of these units or packages such as locking brackets therefore onto the computer's chassis or the electrically conductive material provided on it, while ensuring a secure contact between them.

One way of doing so is to use ordinary screws, which entails several issues. First, one needs a tool to tighten the screws. Also, there is the possibility of a short circuit if a screw drops onto an electrically live part. Furthermore, in cases where a jig is required to tighten the screws and others, it is necessary to attach the jig to the device or to keep the jig somewhere safe so that it can be easily retrieved.

Because of these issues, demand has been increasing for a mechanism for locking units or packages that requires no screws, tools or jigs. For example, Japanese Unexamined Patent Application Publication No. 2003-318575 (JP-A-2003-318575) discloses, as a locking mechanism for locking boards such as PCI cards onto the chassis of a personal computer or a similar piece of equipment without using a tool, a locking mechanism comprising a base plate that is directly placed on the chassis, a stopper plate that presses and holds down a metal piece for locking the boards onto the chassis, and a lock plate that keeps the stopper plate in the hold-down position. Further, Japanese Unexamined Patent Application Publication No. 2007-184359 (JP-A-2007-184359) discloses, as a locking mechanism for locking units or packages onto the chassis of an electronic device or a similar piece of equipment without using a tool, a locking mechanism comprising a mechanical part for pressing and holding a metal piece (such as a bracket) in place that belongs to each such unit or package, a cylindrical supporter for rotating this mechanical part, and a screw or a set of screws for holding the mechanical part so that it will not fall off the supporter.

One of the disadvantages of the locking mechanism disclosed in JP-A-2003-318575 lies in the fact that, while it does not require any tools, it does require many components such as a base plate, a stopper plate, a coil spring, and a lock plate, which pushes up the component cost. Furthermore, it involves a rather complex operation: two or more steps are needed to securely lock the boards.

Likewise, the locking mechanism disclosed in JP-A-2007-184359, which does not require any tools and involves only one step of operation to securely lock the units or packages, has similar problems if there is more than one board to lock: It is necessary to prepare as many locking mechanisms as the number of boards to lock, which leads to an increase in the number of steps in operation and also pushes up the component cost.

SUMMARY OF THE INVENTION

The object of the present invention is to provide an easy-to-operate mechanism for locking one or more boards onto the chassis of an electronic device with a small number of components.

To meet the above-mentioned object, the present invention provides a mechanism for locking one or more boards with components mounted on them onto the chassis of en electronic device according to a preferred embodiment is comprised of a number of brackets, each of which is attached to each of the boards and which are to be mounted onto the chassis in alignment with a series of fixation spots provided on the chassis at intervals of a predetermined length and a locking element having a number of tongue-shaped pieces (hereinafter called tongues), so arranged that the boards can be locked onto the chassis by engaging each such tongue with the pair of adjacent brackets on either side.

Further, according to a preferred embodiment, the tip of each tongue in the locking element is provided with a first protrusion, so that the boards can be locked onto the chassis by engaging each such protrusion with the pair of adjacent brackets on either side.

Further, according to a preferred embodiment, the tongue is formed thinner on either side, so that the thinner part functions as a presser flange. The flange serves to press and hold in place the pair of adjacent brackets on either side.

Further, according to a preferred embodiment, the locking element is provided with a chassis-attaching part which slides along the chassis, so that each tongue comes into engagement with a pair of adjacent brackets.

Further, according to a preferred embodiment, the chassis-attaching part is equipped with a sliding mechanism that allows it to slide along the chassis.

Further, according to a preferred embodiment, the locking element is provided with a guide hole for sliding along the chassis.

Further, according to a preferred embodiment, the locking element is provided with a second protrusion so that it can be locked at a certain position relative to the chassis when the second protrusion engages with a dimple provided on the chassis.

Further, according to a preferred embodiment, the chassis-attaching part is provided with a rotating mechanism that allows it to rotate toward the brackets.

Further, according to a preferred embodiment, the locking element is provided with a hook so that it can be locked onto the chassis when the hook engages with an eye provided at the corresponding position on the chassis.

Further, according to a preferred embodiment, the locking element is made of an elastic material.

Further, according to a preferred embodiment, the bracket is provided with a notch, so that when a protrusion provided on the fixation spot on the chassis engages with the notch, the bracket is locked onto the chassis.

Thus, the present invention offers an easy-to-operate mechanism for locking one or more boards onto the chassis of an electronic device using a small number of components.

DESCRIPTION OF THE PREFERRED EMBODIMENTS

Figure 1:
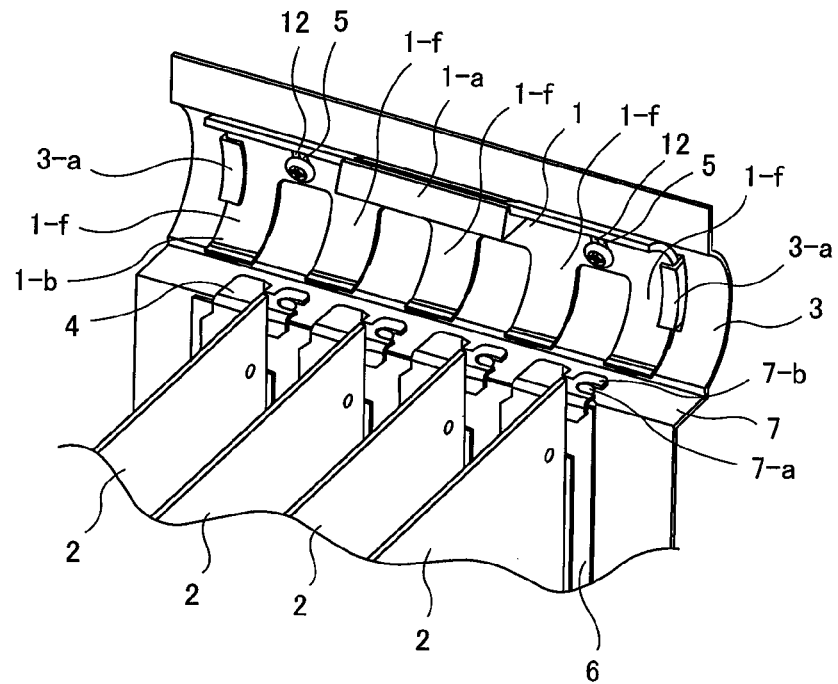
FIG. 1 is a partial perspective view of the locking element 1 in the unlocked state according to a first embodiment of the present invention.

Referring now to the drawings, preferred embodiments are described herein.

Preferred Embodiment 1

First, by way of example and with reference to FIGS. 1 through 6, a description is hereby provided of a mechanism for locking boards 2 such as packages onto the chassis 3 of an electronic device and the operation thereof according to a first preferred embodiment of the present invention.

FIG. 1 is a partial perspective view of several boards 2 (for example, printed circuit boards) inserted perpendicularly into a series of slots (not shown in the figure) provided at certain intervals on a motherboard that is securely fixed on the chassis 3 of an electronic device.

Attached to each of the boards 2 is a bracket 4 made of a metal plate. The brackets 4 are then mounted onto a mounting platform 7 of the chassis 3 at intervals of a predetermined length.

The mounting platform 7 is provided with a series of protrusions 7-a, to which a series of slits 7-b corresponds, each of which is a notch provided on the bracket 4 on each board 2. Engagement between the series of protrusions 7-a and the series of slits 7-b prevents the movement of the brackets 4 perpendicular to the mounting platform 7.

The locking element 1 is attached to the cylindrical inner surface of the chassis 3 using one or more screws 5 and one or more guides 3-a. Further, an electromagnetic shield 6 is inserted between each bracket 4 and the chassis 3.

The locking element 1 is a single-piece component made of a tough elastic material (for example, PC+ABS plastic) and has a number of tongues 1-f. It also has a handle 1-a and a number of locking slips 1-b. Pressing the handle 1-a causes the locking element 1, which has a guide hole 12, to slide along the cylindrical inner surface of the chassis 3 as the screw 5 moves along the guide hole 12, and as a result, the locking slip 1-b moves over a pair of adjacent brackets 4, thereby locking them there. In effect, the guide hole 12 and the screw 5 constitute a sliding mechanism. The locking slip 1-b is positioned halfway between two adjacent brackets 4 and therefore locks these two brackets 4 on either side at the same time.

Since the boards 2 are mounted onto the chassis independently of each other, the heights (in the direction of the thickness of the electromagnetic shield 6) of the brackets 4 are not uniform. The differences in height of the brackets 4 are absorbed by the elasticity of the plastic material used in the locking slips 1-b that hold them down.

Figure 2:
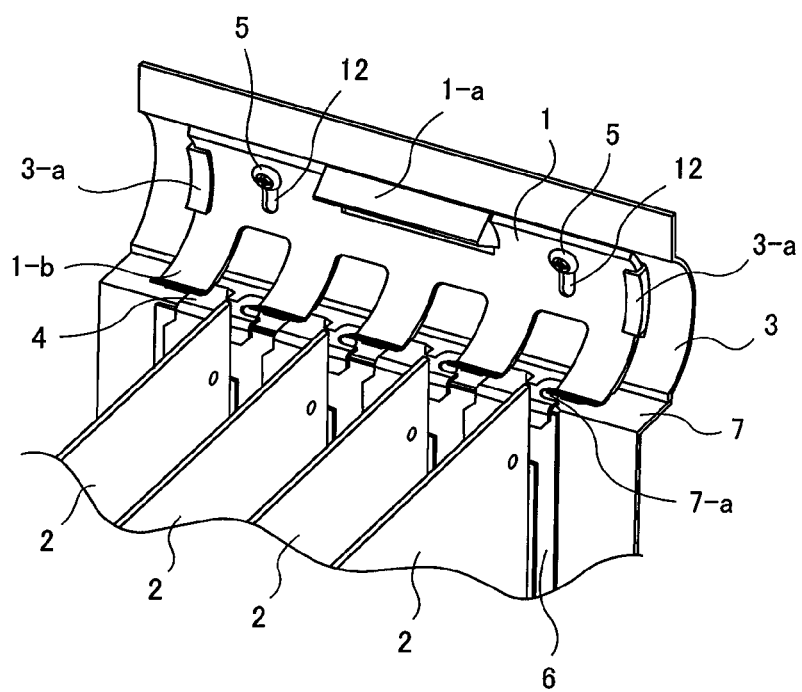
FIG. 2 is a partial perspective diagram showing how the locking element 1 holds the brackets in place.

FIG. 2 is a partial perspective view that illustrates how the locking element 1 locks boards 2, such as I/O packages.

To unlock the boards, one can follow the above-described procedure in reverse order. Sliding the handle 1-a upward causes all the boards 2 to be unlocked, as shown in FIG. 1, so that they can be unplugged from the slots.

Figure 4:
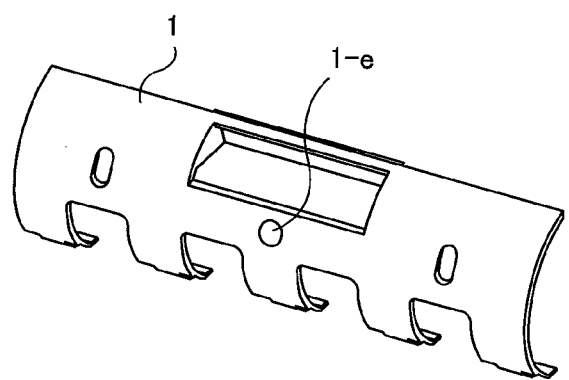
FIG. 4 is a perspective view of the back of the locking element 1.

FIG. 4 is a perspective view of the back of the locking element 1, which has a protrusion 1-e on its back. The chassis 3 has a dimple or a hole at the position that corresponds to the protrusion 1-e of the locking element 1 in the unlocking position and at another place that corresponds to the same in the locking position (although not explicitly shown in FIG. 1 or FIG. 2). Thus, the protrusion 1-e works to keep the locking element 1 in either the unlocking position or the locking position, thereby serving to keep the locking element 1 and the chassis 3 together.

Figure 5:
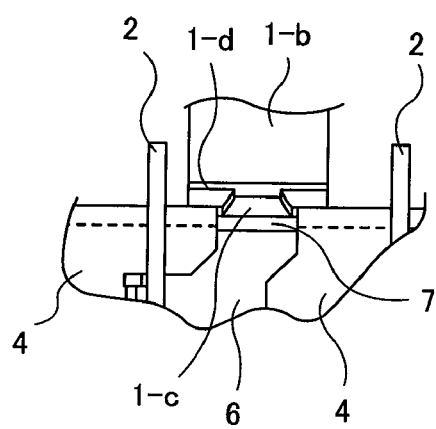
FIG. 5 is a magnified anterior view of the locking element 1 holding down the brackets in place.
Figure 6:
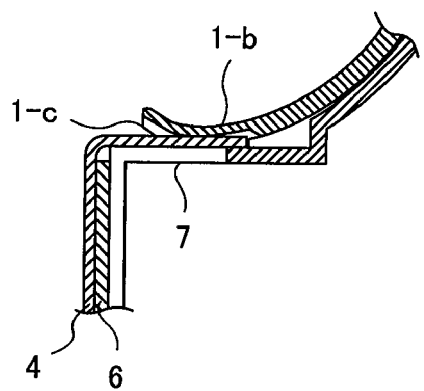
FIG. 6 is a magnified cross-sectional view of the locking element 1 holding down the brackets in place.

Next, with reference to FIGS. 3, 5, and 6, follows an explanation of how the locking slip 1-b securely locks the brackets 4.

Figure 3A:
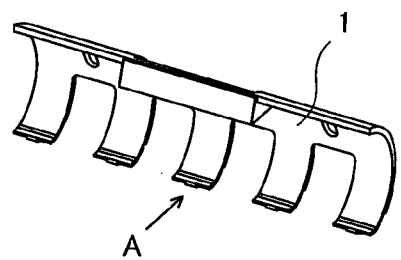
FIG. 3A presents a perspective view of the locking element 1.
Figure 3B:
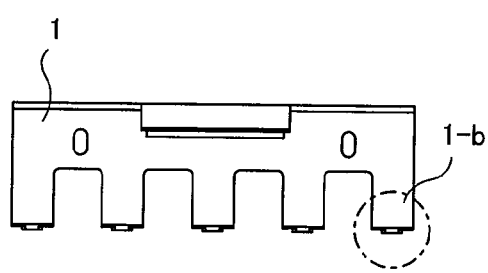
FIG. 3B presents an anterior view of the locking element 1.

FIG. 3A is a perspective view of the locking element 1. FIG. 3B is an anterior view taken from arrow A in FIG. 3A, FIG. 3C is a detailed view of the locking slip 1-b, and FIG. 3D is a perspective view of the locking slip 1-b taken from arrow B in FIG. 3C.

Figure 3C:
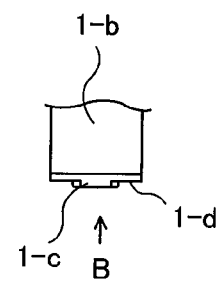
FIG. 3C shows the details of the locking slips on the tongue.
Figure 3D:
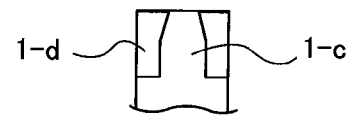
FIG. 3D shows a perspective view of the locking slips on the tongue.

As shown in FIG. 3C, the tip of the locking slip 1-b is formed with an inverse protrusion 1-c at its center and a bracket presser flange 1-d on either side, which is thinner than the protrusion 1-c, with the lower part chipped away. Further, as shown in FIG. 3D, the protrusion 1-c is tapered toward its tip.

FIG. 5 is a magnified anterior view of the locking slip 1-b when the bracket 4 is in the locked state, whereas FIG. 6 is a magnified cross-sectional view of the same.

The protrusion 1-c is fixed between two adjacent brackets 4 and in turn locks them in the lateral direction. The bracket presser flange 1-d presses the two adjacent brackets 4 from above, thus locking them in the vertical direction.

As the locking element 1 is slid along the cylindrical inner surface of the chassis 3 from the unlocking position (FIG. 1) to the locking position (FIG. 2), the tapering tip of the protrusion 1-c serves as a guide for the two adjacent brackets 4, since it leads them into their right positions by absorbing the differences in their lateral positions when in the unlocked state.

The first preferred embodiment described above minimizes the number of components, thereby reducing the component cost compared with conventional locking mechanisms, since the locking element 1 can be composed of a single piece of plastic material. It also makes the operation easier, since only a single step of action (i.e., pressing the handle 1-a) is required to switch from the unlocked state to the locked state and vice versa.

Furthermore, as a result of the toughness and elasticity of the plastic material, it is possible to lock multiple boards simultaneously in a single step of operation while absorbing the differences in their height.

It should be noted that, while the embodiment described above employs both a screw 5 and a guide 3-*a* to attach the locking element 1 to the chassis 3, the same effect can be achieved by employing only a screw 5 or a guide 3-*a*.

It should be noted further that, while the protrusion 1-*e* of the locking element 1 serves to fix the locking element 1 itself both when the boards 2 are locked and when they are unlocked, a different embodiment is possible in which the protrusion 1-*e* is surrounded by a slit so that it will have a spring-like effect.

Preferred Embodiment 2

Next, by way of example and with reference to FIGS. 7 through 11, a description is hereby provided of a mechanism for locking boards 2 such as packages onto the chassis 11 of an electronic device and the operation thereof according to a second preferred embodiment of the present invention.

Figure 7:
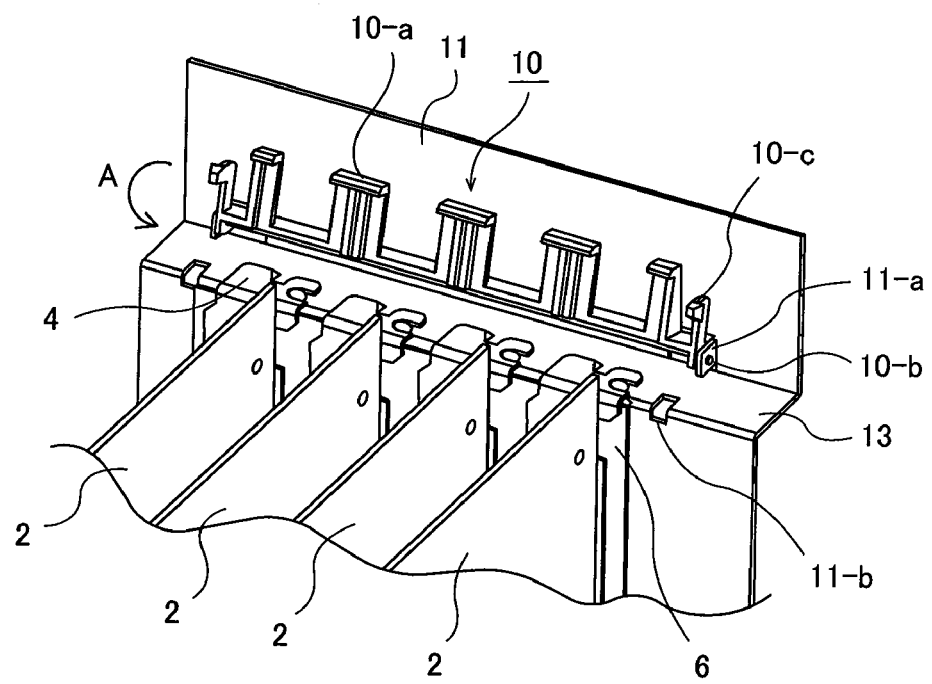
FIG. 7 is a partial perspective view of the locking element 10 in the unlocked state according to a second embodiment of the present invention.

FIG. 7 is a partial perspective view showing the boards 2 inserted in a series of slots (not shown) provided on the chassis 11 of an electronic device. Attached to each board 2 is a bracket 4 made of a metal plate, which is in turn mounted onto the mounting platform 13 on the chassis 11. The locking element 10 can be attached to the chassis 11 by inserting its cylindrical guide 10-*b* into a pair of guide holes 11-*a* provided at either end of the chassis 11.

The locking element 10 is a single-piece component made of a tough elastic plastic material (for example, PC+ABS plastic) and is provided with one or more locking slips 10-*a*. The cylindrical guide 10-*b* of the locking element 10 and the guide holes 11-*a* constitute a hinge-like rotation mechanism such that the locking element 10 rotates around the cylindrical guide 10-*b*. Further, an electromagnetic shield 6 is inserted between the brackets 4 and the chassis 11.

Figure 8:
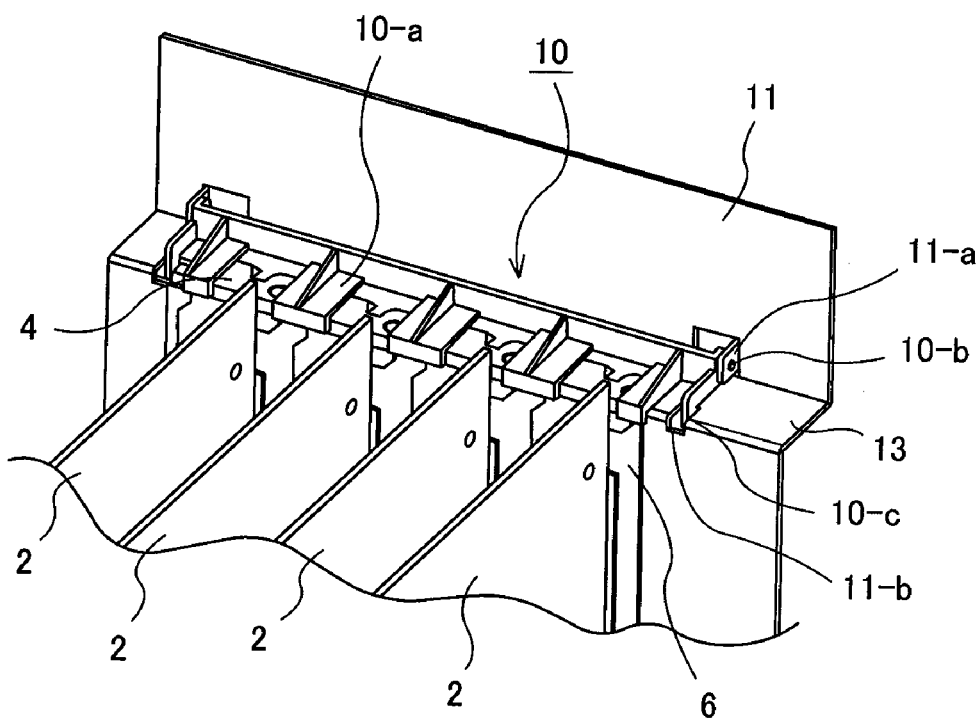
FIG. 8 is a perspective view of the locking element 10 holding down the brackets in place.

FIG. 8 is a partial perspective view showing how the locking element 10 locks the boards 2 such as I/O packages, which are inserted into a series of slots (not shown) provided on the chassis 11 of an electronic device. To lock the boards 2, one rotates the locking element 10 in direction "A" around the cylindrical guide 10-*b* while in the unlocked state (FIG. 7). Locking is accomplished when a claw-shaped hook 10-*c* of the locking element 10 engages with an eye 11-*b* on the chassis 11. In the locked state, one locking slip 10-*a* is positioned between a pair of adjacent brackets 4 directly on top of them so that it holds them in place.

To unlock the boards 2, one performs the above-described procedure in reverse order, namely, first disengages the hook 10-*c* from the eye 11-*b* and then rotates the locking element 10 in the opposite direction to "A," which leaves the locking element 10 in the unlocked state (shown in FIG. 7), so that any of the boards 2 can be unplugged from the corresponding slot. Further, the differences in height of the brackets 4 are absorbed by the elasticity of the plastic material used in their corresponding locking slips 10-*a*.

Figure 9:
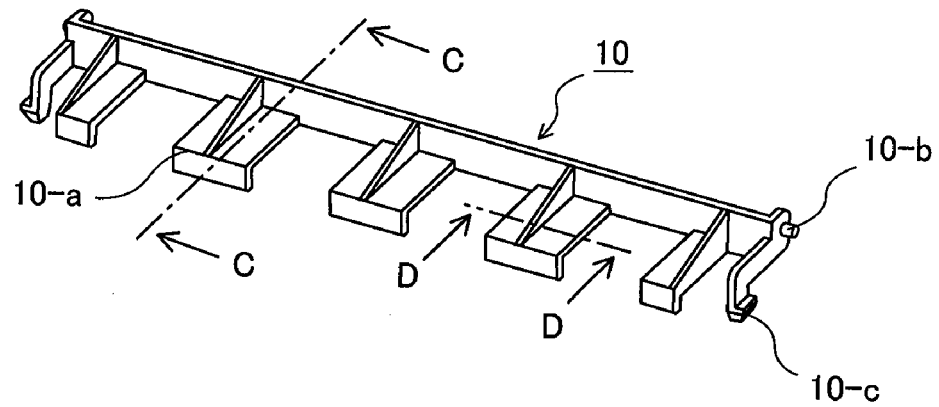
FIG. 9 is a perspective view of the locking element 10.
Figure 10:
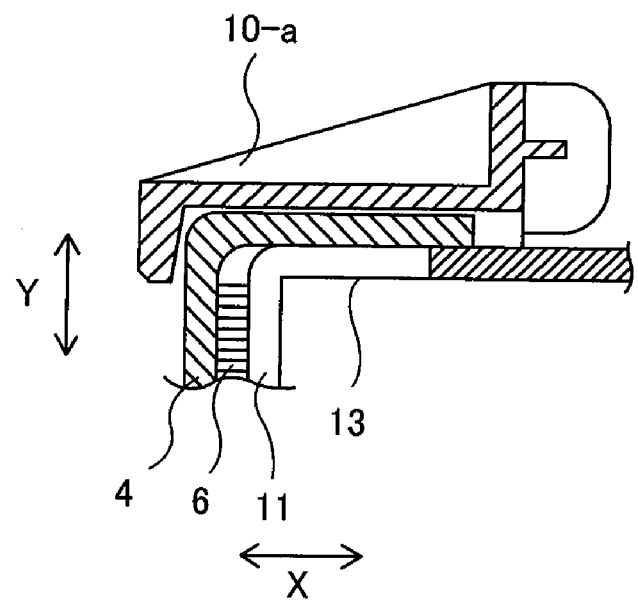
FIG. 10 is a cross-sectional side view of the locking element 10 holding down the brackets in place.
Figure 11:
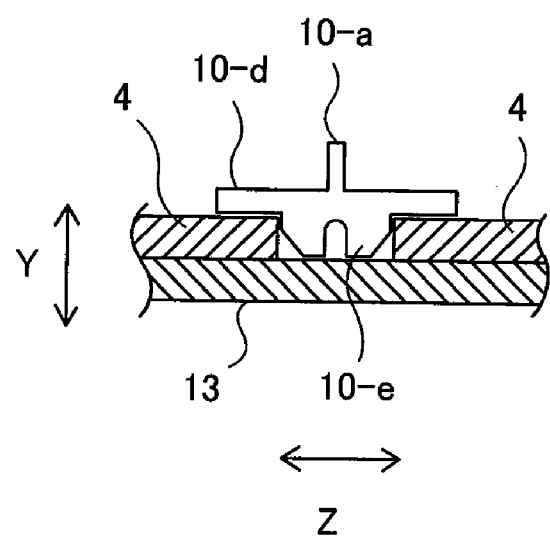
FIG. 11 is a cross-sectional anterior view of the locking element 10 holding down the brackets in place.

Next, with reference to FIGS. 9 through 11, a description is hereby provided of how the locking slip 10-*a* holds the brackets 4 in the locked position.

FIG. 9 is a perspective view of a typical construction of the locking element 10; FIG. 10 and FIG. 11 are the cross-sectional views of the locking element 10 taken from the lines C-C and D-D, respectively.

As shown in FIG. 10, the C-C cross-section of the locking slip 10-*a* has a double-"L" shape, which serves to hold the pair of brackets 4 both in the vertical (Y) direction and in the depth (X) direction. As the bracket 4 is held tightly in the depth (X) direction, the electromagnetic shield 6 inserted between the bracket 4 and the chassis 11 is tightly squeezed, so that it comes into firm contact with both the bracket 4 and the chassis 11 at the same time, and as a result, an electromagnetic shielding effect is secured.

As shown in FIG. 11, the D-D cross-section of the locking slip 10-*a* is formed with an inverse protrusion, which has a bracket presser flange 10-*d* and a protrusion 10-*e*. In the locked state, the protrusion 10-*e* is positioned between two adjacent brackets 4, and in turn holds them in place in the lateral (Z) direction. At the same time, the bracket presser flange 10-*d* presses down the two adjacent brackets 4 and holds them in place in the vertical (Y) direction.

Furthermore, the protrusion 10-*e* is tapered toward its tip. As the locking element 10 is rotated around from the unlocking position (FIG. 7) to the locking position (FIG. 8), the tapering tip of the protrusion 10-*e* serves as a guide for the two adjacent brackets 4, since it leads them into their right positions by absorbing the differences in their lateral positions (in the Z direction) when in the unlocked state.

The second preferred embodiment described above minimizes the number of components, since the locking element 10 can be composed of a single piece of plastic material. Also, unlike the first embodiment, it does not require screws to attach the locking element 10 to the chassis 11 and therefore further reduces the component cost compared with conventional locking mechanisms as well as the first embodiment.

It also makes the operation easier, since only a single step of action, i.e., pressing the handle 1-*a*, is required to switch from the unlocked state to the locked state and vice versa. Furthermore, as a result of the toughness and elasticity of the plastic material, it is possible to lock multiple boards simultaneously in a single step of operation while absorbing the differences in their height.

This invention may be practiced or embodied in various ways other than described above, without departing from the spirit or essential character thereof. The preferred embodiments described herein are illustrative and not restrictive, the scope of the invention being indicated by the appended claims, and all variations that come within the meaning of the claims are intended to be embraced therein.

What is claimed is:

1. A mechanism for locking boards with components mounted on them onto a chassis of an electronic device, comprising:
   a plurality of brackets, each of which is attached to each of said boards and which are to be mounted onto said chassis at a series of fixation spots disposed on said chassis at intervals of a predetermined length, and
   a locking element which is a single-piece component having a plurality of tongues configured so that locking is accomplished by inserting each of said tongues between a pair of adjacent ones of said brackets and so that each of said tongues engages with the pair of adjacent ones of said brackets for attachment onto the chassis,
   wherein a tip of each said tongues of said locking element has a first protrusion,
   wherein locking in a lateral direction is accomplished by inserting and engaging said first protrusion between a pair of adjacent ones of said brackets, and
   wherein each of said tongues has, on each side of said protrusion, a presser flange formed with a chipped-away cavity, which presses down said pair of adjacent ones of said brackets and holds said pair of adjacent ones of said brackets in place in a vertical direction.

2. A mechanism for locking boards onto a chassis of an electronic device according to claim 1,
wherein said locking element has a chassis-attaching part for attachment onto said chassis, whose movement relative to said chassis causes said tongues of said locking element to be inserted between a pair of adjacent ones of said brackets and to engage with said pair of adjacent ones of said brackets.

3. A mechanism for locking boards onto a chassis of an electronic device according to claim 1,
wherein said locking element is composed of an elastic material.

4. A mechanism for locking boards onto a chassis of an electronic device according to claim 1,
wherein each of said brackets has a notch, which, when engaged with a protrusion correspondingly disposed at a fixation spot on said chassis, causes said board to be locked onto said chassis.

5. A mechanism for locking boards onto a chassis of an electronic device according to claim 1,
wherein said first protrusion is tapered toward its tip and the tapering tip of said first protrusion serves as a guide for the two adjacent brackets.

6. A mechanism for locking boards onto a chassis of an electronic device according to claim 2,
wherein said chassis-attaching part has a mechanism for sliding along a contour of said chassis.

7. A mechanism for locking boards onto a chassis of an electronic device according to claim 2,
wherein said chassis-attaching part has a rotation mechanism allowing said chassis-attaching part to rotate toward said brackets.

8. A mechanism for locking boards onto a chassis of an electronic device according to claim 6,
wherein said locking element has a guide hole for sliding along said chassis.

9. A mechanism for locking boards onto a chassis of an electronic device according to claim 6,
wherein said locking element has a second protrusion at a certain position, which, when engaged with a dimple disposed at a corresponding position on said chassis, causes said locking element to be locked onto said chassis and keeps said locking element and said chassis together.

* * * * *